United States Patent
Lin et al.

(10) Patent No.: US 6,621,756 B2
(45) Date of Patent: Sep. 16, 2003

(54) COMPACT INTEGRATED CIRCUIT WITH MEMORY ARRAY

(75) Inventors: Chin-Hsi Lin, Hsin-Chu (TW); Meng-Chu Huang, Tainan (TW); Chun-Li Chen, Nan-Tao (TW); Ful-Long Ni, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/991,786

(22) Filed: Nov. 26, 2001

(65) Prior Publication Data

US 2003/0099146 A1 May 29, 2003

(51) Int. Cl.⁷ .................................................. G11C 8/00
(52) U.S. Cl. .............................. 365/230.03; 365/230.06
(58) Field of Search ........................ 365/230.03, 230.06

(56) References Cited

U.S. PATENT DOCUMENTS

| | | | | |
|---|---|---|---|---|
| 5,701,269 A | * | 12/1997 | Fujii | 365/210 |
| 6,047,352 A | * | 4/2000 | Lakhani et al. | 711/5 |
| 6,058,053 A | * | 5/2000 | Tsuji et al. | 365/200 |
| 6,339,358 B1 | * | 1/2002 | Horiguchi et al. | 327/544 |

OTHER PUBLICATIONS

Betty Prince, "Semiconductor Memories", 1983, Wiley, 2$^{nd}$ edition, pp. 162–163.*

* cited by examiner

*Primary Examiner*—M. Tran

(57) ABSTRACT

A compact integrated circuit with memory arrays, shared select transistors and distributed drivers of XDEC is disclosed. The shared select transistors are used to access two adjacent memory cell areas so that the overhead resulting from the conventional select areas can be reduced. The drivers of XDEC are distributed to both sides of the memory arrays to drive the memory cell areas so that conventional transfer areas can be reduced.

9 Claims, 5 Drawing Sheets

COMPACT INTEGRATED CIRCUIT WITH MEMORY ARRAY

BACKGROUND OF THE INVENTION

1. Field of the Invention

The present invention relates to a compact integrated circuit with memory arrays, and more particularly to a compact integrated circuit with memory arrays, shared select transistors and distributed drivers of word line decoder (XDEC).

2. Description of the Related Art

With goals toward increased performance and higher density, various integrated circuit design approaches are known for memory devices such as EPROM, ROM, and other types including electrically-erasable programmable read-only-memory (EEPROM) and flash memory. While modern design approach achieves substantial density and performance, improvements are still desirable. Particularly, array overheads resulting from bank select area, XDECs and YMUXs are necessarily reduced. In the bank select area, the array of bank select transistors present a majority of the overhead. Currently, based on 0.5 micron technology, the bank select area is ⅓ of the memory cell area. FIG. 1 shows a portion of a conventional array having two banks. As shown in FIG. 1, bank 1 has select lines 108a–108d (SEL00–SEL03), select transistors 106a–106h and 32 word lines, wherein WL01–WL30 are omitted for simplicity and each word line such as word line 110a (WL00) and word line 110b (WL31) is coupled to a row of identical memory cells. Global bit lines 102a–102d and local bit lines 104a–104h are also shown in FIG. 1. It is noted that bank 2 is identical to bank 1. In the operation of this array, for example, in the access of memory cell 112, word line 110a, local bit lines 104b and 104c are selected, and local bit lines 104b and 104c electrically connect global bit lines 102b and 102a through select transistor 106e and 106b respectively. Thus if memory cell 112 is selected, a high voltage signal (Logic Level "1")from XDEC is applied to word line 110a, global bit lines 102a and 102b are selected by YMUX, select lines 108b and 108c are activated by select line decoders to activate select transistors 106b and 106e so that local bit line 104b can electrically connect global bit line 102b and local bit line 104c can electrically connects global bit line 102a. The select areas shown in FIG. 1 present large overhead and the chip area occupied by the select transistors is not utilized well. Thus it is obvious that the select areas must be further shrunk for upgrading the chip integration.

Conventional layout also presents large overhead. FIG. 2 shows a conventional driver placement in a periphery region of a conventional integrated circuit layout. Decoder or driver 210a is used to drive a row of memory cells similar to the row of memory cells shown in FIG. 1 in memory cell area 208 via word line 214a. Select word lines 216a–216d (sw10–sw13) are also shown in FIG. 2. Drivers 210b–210d are separately used to drive three rows of memory cells in memory cell area 208 via word lines 214b–214d. Similarly, other identical drivers arrayed below are separately used to drive the rest row of memory cells in memory cell area 208. Pre-decoder area 202 inputs pre-decoded address signal xp0 to drivers 210a–210d via signal line 212 and pre-decoded address signal xp1–xp7 to the identical drivers arrayed below via the signal lines identical to word line 212. As shown in FIG. 2, each driver drives a row of memory cells in memory cell area 208 via a word line and all the 32 word lines pass transfer area 204 into memory cell area 208. Transfer area 204 is necessary because the pitches or thicknesses of lead lines such as polysilicon word lines in periphery region and in memory cell region are different. The word lines must shrink or arrange closer before entering memory cell area 208, and the shrink of the word lines occupy additional chip area as transfer area 204 shown in FIG. 2. Select area 206 is similar to the select area shown in FIG. 1. It is clear that transfer area 204 presents large overhead resulting from the pass and shrink of the word lines. Furthermore, as the process scale advances further, the reduction of a memory cell area would be unavoidable. It will be very difficult to place so many drivers into one memory cell area if maintaining a scheme of one driver driving one word line is still necessary.

In view of the drawbacks mentioned with the prior art layout, there is a continued need to develop new and improved layout that overcome the disadvantages associated with prior art layout. The requirements of this invention are that it solves the problems mentioned above.

SUMMARY OF THE INVENTION

It is therefore an object of the invention to reduce the overhead of integrated circuit resulting from the select areas.

It is another object of this invention to provide an improved integrated circuit layout with smaller transfer areas.

It is a further object of this invention to provide an integrated circuit layout with high integration.

To achieve these objects, and in accordance with the purpose of the invention, the invention provide an integrated circuit with a memory array, said integrated circuit comprising: a plurality of banks, a plurality of word lines, a plurality of local bit lines, a plurality of coupled select transistors arranged between two adjacent said banks, a plurality of global bit lines and a plurality of select lines. Each said bank comprises a plurality of memory cells arranged in rows and columns and each said word line couples each said row of memory cells. Each said local bit line couples said memory cells arranged in the same column of two adjacent said banks and each said select transistor is used to select said memory cells arranged in same column of two adjacent said banks via said local bit line. Said select line couples said select transistors of said coupled select transistors and said global bit line couples said coupled select transistors.

The invention also provides an integrated circuit with distributed drivers of XDEC, the integrated circuit comprises a pre-decoder area, a plurality of driver areas, wherein each said driver area is pre-decoded by said pre-decoder area, and a plurality of memory array areas, wherein each said memory array area has two said driver areas on both sides of each said memory array area to drive each said memory array area.

In another embodiment of this invention, the integrated circuit with distributed drivers of XDEC comprises a pre-decoder area, a plurality of driver areas, wherein each said driver area is pre-decoded by said pre-decoder area, and a plurality of memory array areas, wherein each said memory array area has two said driver areas on both sides of each said memory array area to drive each said memory array area, and each said memory array area comprises a plurality of memory cell areas and a plurality of select areas, wherein each said select area is between two adjacent said memory cell areas and has a plurality of coupled select transistors, and each said select transistor of said coupled select transistors couples two adjacent said memory cell areas.

The invention also provides a method of selecting a memory cell in the integrated circuit, the method comprises the steps of selecting two said select lines separately on two sides of a bank having said memory cell to decode said select transistors and select said bank, selecting two said global bit lines to select two said select transistors coupling said memory cell via two said local bit lines and selecting said word line coupling said memory cell.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the integrated circuit layouts described below do not cover a complete integrated circuit layout. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 3:
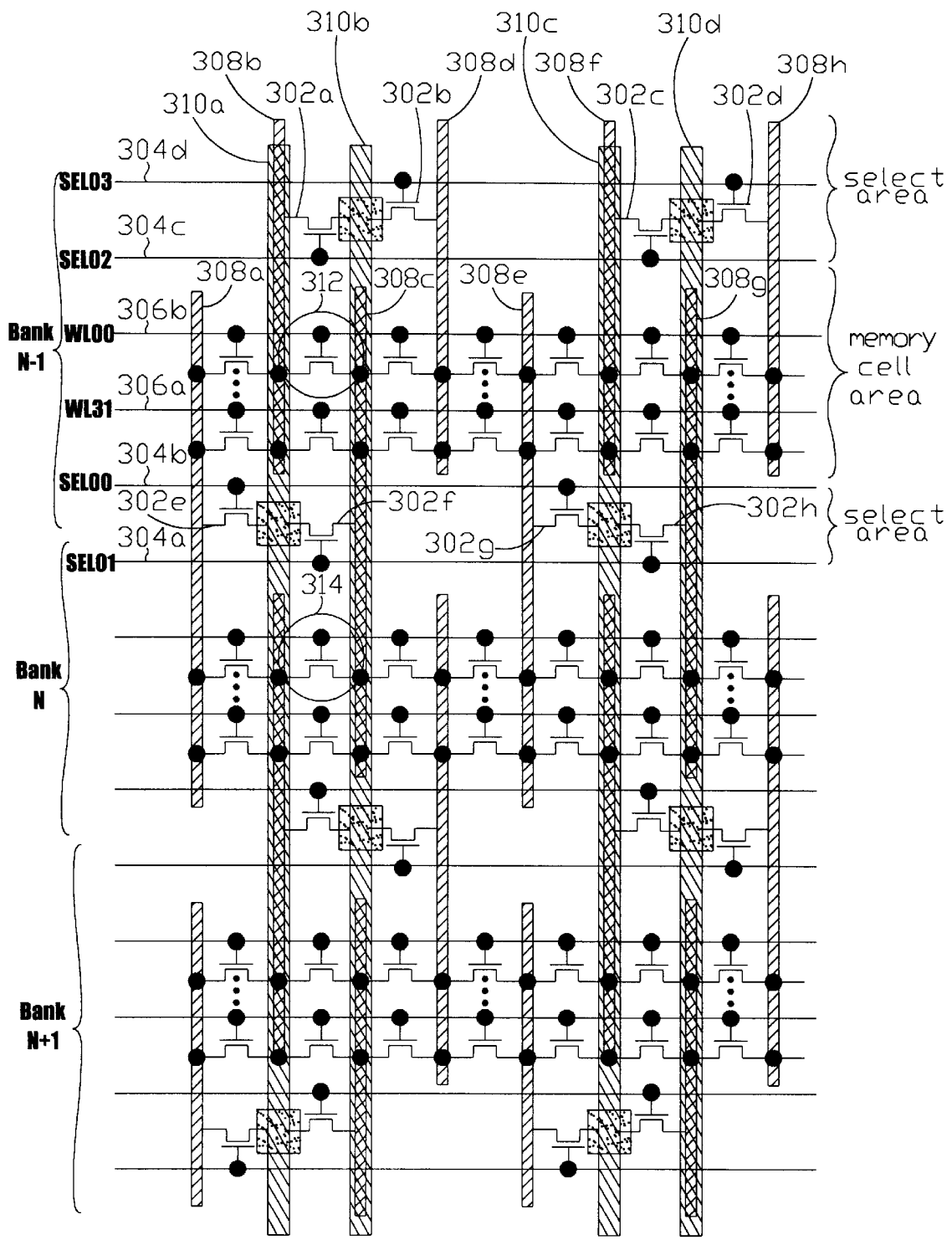
FIG. 3 shows a portion of array of this invention having 3 banks.

Referring to FIG. 3, a portion of array of this invention having bank N−1 ($BK_{n-1}$), bank N ($BK_n$) and bank N+1 ($BK_{n+}$) is shown. As shown in FIG. 3, select transistors and select lines are shared between the adjacent banks in this array. Select transistors 302a–302h, select lines 304a–304d, global bit lines 310a–310d and local bit lines 308a–308h are shown in this figure. For example, select transistors 302e–302h and select lines 304a and 304b are shared between bank N−1 ($BK_{n-1}$) and bank N ($BK_n$). In the access of memory cell 312, word line 306b, local bit lines 308b and 308c are selected, and local bit lines 308b and 308c electrically connect global bit line 310b and 310a through select transistor 302a and 302f respectively. Thus if memory cell 312 is selected, a high voltage signal (Logic Level "1") from XDEC is applied to word line 306b, global bit lines 310a and 310b are selected by YMUX, select lines 304a and 304c are activated by select line decoders to activate select transistors 302a and 302f so that local bit line 308b can electrically connect global bit line 310b and local bit line 308c can electrically connects global bit line 310a. For accessing memory cell 314 in bank N ($BK_n$), local bit line 308c must be selected which means that global bit line 310a must be selected and select line 304a is activated to turn on select transistor 302f. Thus select line 304a and select transistor 302f are shared between bank N−1 ($BK_{n-1}$) and bank N ($BK_n$). Other select lines and select transistors identical to select line 304a and select transistor 302f are operated in a similar manner. For accessing memory cell 312 in bank N−1 ($BK_{n-1}$), a bit line signal is transmitted from select transistor 302a and select transistor 302f to memory cell 312 via local bit line 308b and local bit line 308c. To accessing memory cell 314 in bank N ($BK_n$), select transistor 302f and local bit line 308c must also be selected. Thus local bit line 308c are shared between bank N−1 ($BK_{n-1}$) and bank N ($BK_n$) and other local bit lines are also shared between two adjacent banks. The memory cells preferably comprise, but are not limited to: electric programmable read only memory (EPROM) cells, flash memory cells, ROM cells, electrically-erasable programmable read-only-memory (EEPROM) cells and ferro-electric random access memory (FRAM) cells.

Figure 1:
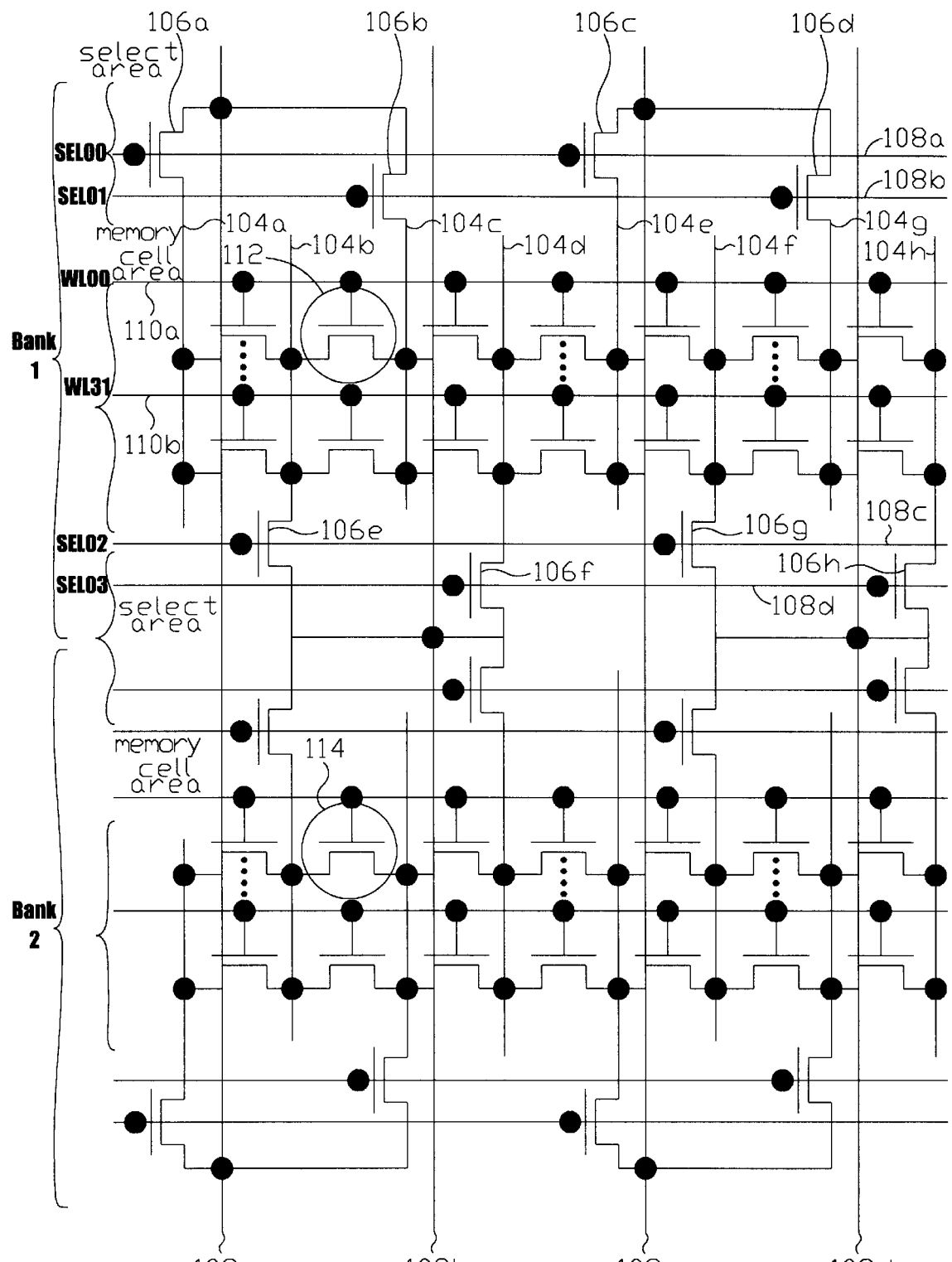
FIG. 1 shows a portion of a conventional array having two banks.

Comparing the conventional array shown in FIG. 1 with the array shown in FIG. 3, select lines 108c and 108a and select transistors 106e–106h are not shared between the two adjacent bank 1 and bank 2. For accessing memory cell 112, select lines 108b and 108c are selected, and the bit line signal is separately transmitted from select transistor 106b and 106e to memory cell 112 via local bit line 104c and 104b. For accessing memory cell 114 in bank 2, other select lines are selected, and the bit line signal is transmitted from other identical select transistors to memory cell 114 via other local bit lines, not select transistors 106b, 106e and local bit lines 104c and 104b. As shown in FIG. 1, one bank must use 4 select lines and 8 select transistors to access all memory cells in its memory cell area. For bank 1, select lines 108a–108d and select transistors 106a–106h are the 4 select lines and 8 select transistors, and the select areas occupied by these select lines and select transistors are about ⅓ the memory cell areas. As shown in FIG. 3, one bank of the array of this invention shares 4 select lines and 8 select transistors with two adjacent banks, and the select areas occupied by these select lines and select transistors are also about ⅓ the memory cell areas. However, because the select lines and select transistors are shared between adjacent banks in this array of this invention, the equivalent area of the select areas in FIG. 3 is just half the area of the select areas in FIG. 1 for the same memory cell area and thus the overhead of select areas is half reduced.

Figure 2:
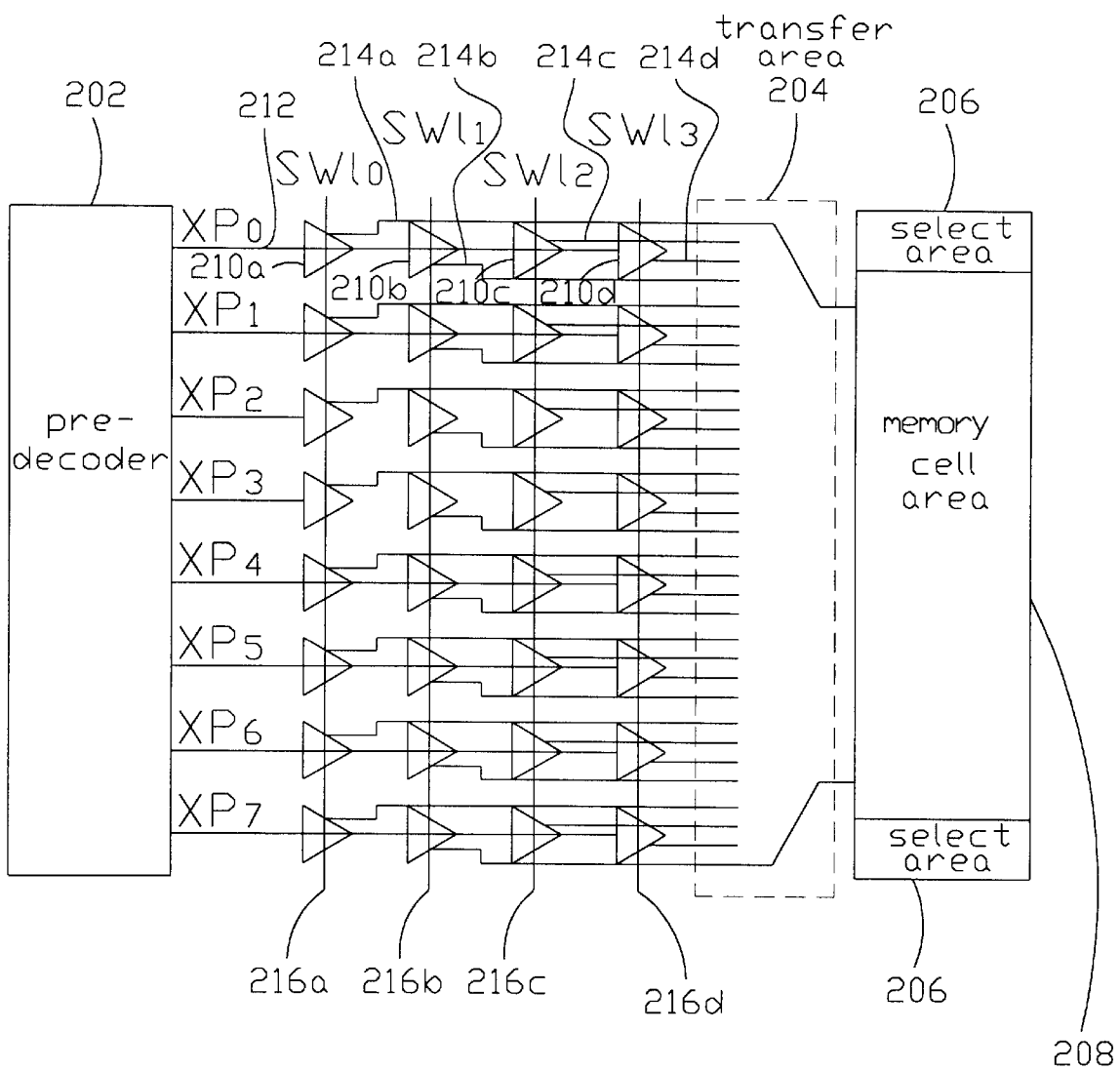
FIG. 2 shows a conventional driver placement in a periphery region of a conventional integrated circuit layout.
Figure 4:
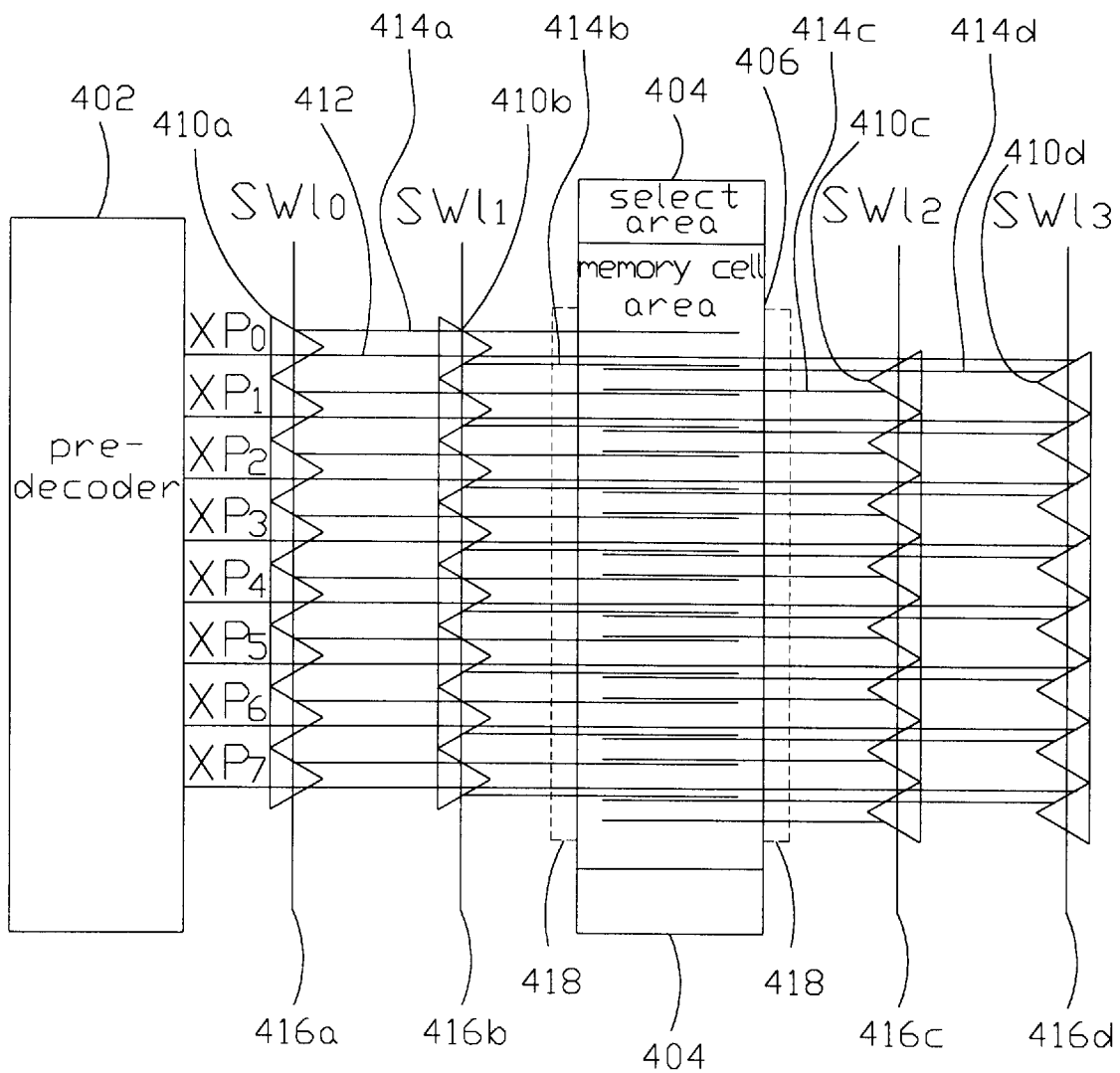
FIG. 4 shows a layout with distributed drivers of XDEC.

Referring to FIG. 4, a layout with distributed drivers of XDEC is shown. Memory cell area 406, select area 404, pre-decoder area 402, transfer area 418, drivers and word lines are shown. Owing to the distribution of drivers on two sides of memory cell area 406, the numbers of word lines entering memory cell area 406 from either side of memory cell area 406 are half the numbers of the word lines entering memory cell area 208 shown in FIG. 2, therefore the transfer area resulting from the shrink of word lines before entering memory cell areas can be greatly reduced. Furthermore, with the same height of one memory cell area shown in FIG. 2, the numbers of drivers and word lines on each side of memory cell area 406 are half the numbers of drivers and word lines on one side of memory cell area 208 and thus the difficulty in layout could be reduced. Decoder or driver 410a is used to drive a row of memory cells similar to the row of memory cells shown in FIG. 3 in memory cell area 406 via word line 414a. Select word lines 416a–416d (sw10–sw13) are also shown in this figure. Driver 410b drives a row of memory cells in memory cell area 406 via word line 414b.

Drivers 410c and 410d on the right side of memory cell area 406 are separately operated in a manner similar to drivers 410a and 410b. Similarly, other identical drivers are separately used to drive the rest row of memory cells in memory cell area 406. Pre-decoder area 402 inputs pre-decoded address signal xp0 to drivers 410a–410d via signal line 412 and pre-decoded address signal xp1–xp7 to the identical drivers on both sides of memory cell area 406 via the signal lines identical to signal line 412. As shown in FIG. 4, for driving memory cell areas 406 with 32 rows of memory cells, this layout with distributed drivers of XDEC of this invention uses a transfer area smaller than transfer area 204 so that the overhead resulting from the transfer area can be reduced. It is noted that the numbers of drivers and memory cells are just examples. The number of drivers can be 32 or more than 32 or less than 32 on each side of memory cell area 406 and memory cell area 406 can also has 64 rows of memory cells or more than 64 rows or less than 64 rows.

Figure 5:
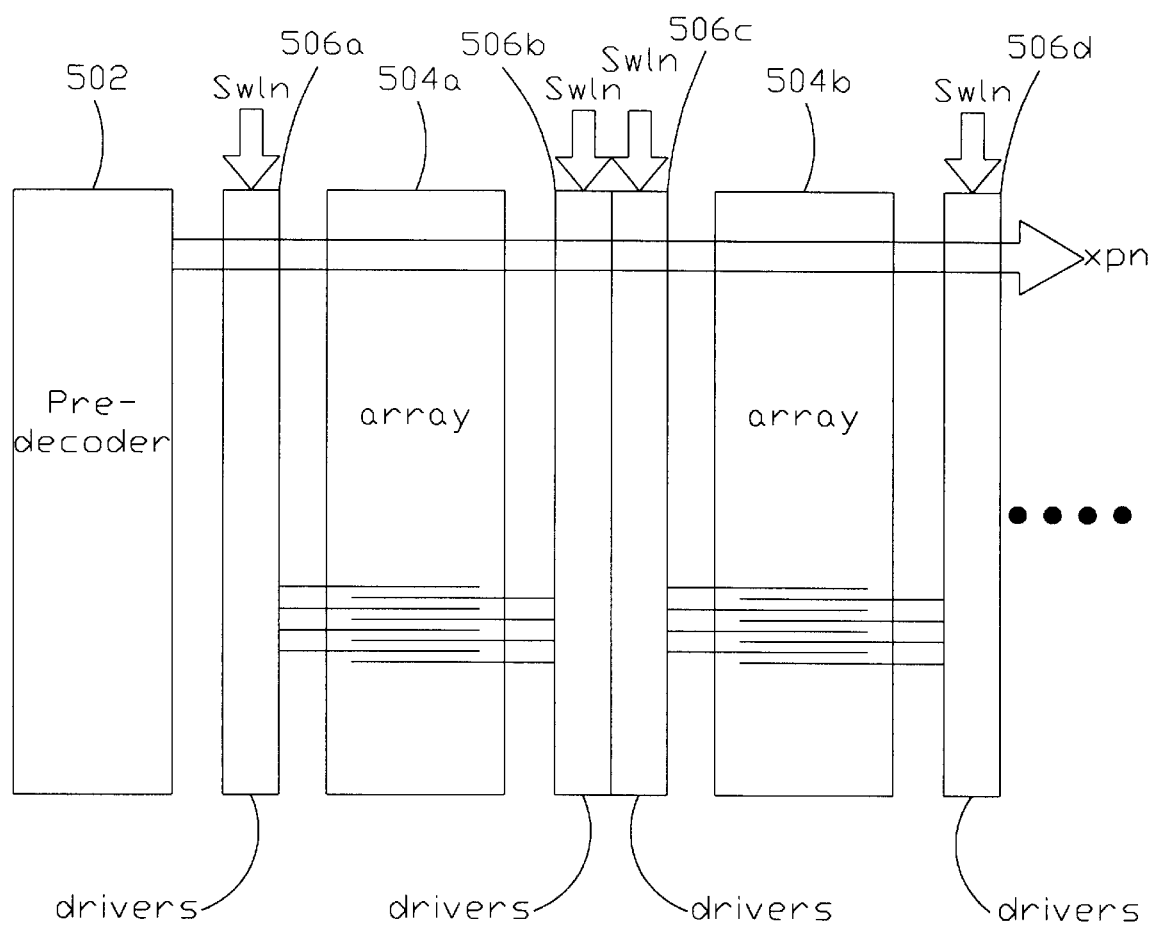
FIG. 5 shows a layout of with more than two array blocks and distributed drivers of XDEC.

FIG. 5 shows a layout of with more than two memory array areas and driver areas with distributed drivers of XDEC arranged in rows and columns. Memory array areas 504a and 504b have memory cell areas and select areas arranged in rows and columns, each memory cell area and select area are similar to memory cell area 406, select area 404 and the memory cell areas and select areas shown in FIG. 3, and driver areas 506a–506d have similar distributed drivers of XDEC shown in FIG. 4. Swln are select word line signals. Pre-decoder area 502 inputs pre-decoded address signals xpn to the distributed drivers in driver areas 506a–506d and more identical driver areas next to driver area 506d. With distributed drivers of XDEC, the layout of this invention not only can reduce transfer area thereby decrease the overhead resulting from the transfer area but also can reduce the word line delay. Because transfer area 418 is smaller than transfer area 204, the length of each word line in FIG. 4 is shorter than the length of each word line in FIG. 2. Thus the symmetric array of word lines shown in FIG. 4 presents less delay than the array of word lines shown in FIG. 2. Moreover, the delay resulting from the symmetric arrayed word lines such as word lines 414a–414d depends only on the size of the memory array area such as memory array areas 504a and 504b.

To reduce the overhead as much as possible, shared select transistors between adjacent banks and distributed drivers of XDEC should be applied to the same integrated circuit layout. For example, as shown in FIG. 4, select area 404 and memory cell area 406 have the configuration shown in FIG. 3. That is, memory cell area 406 is identical to the memory cell area in FIG. 3 and select area 404 is identical to the select area in FIG. 3. Memory array areas 504a and 504b have memory cell areas and select areas such as the memory cell area and the select area in FIG. 3 arranged in rows and columns.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. An integrated circuit with a memory array, said integrated circuit comprising:
   a plurality of banks, each of said banks comprising a plurality of memory cells arranged in rows and columns;
   a plurality of sets of word lines, wherein each of said sets of word lines is for accessing one of said banks, and wherein each said word line couples the memory cells of one of said rows;
   a plurality of global bit lines;
   a plurality of local bit lines, each said local bit line coupling the memory cells arranged in the same column of two adjacent said banks; and
   a plurality of select transistors each being coupled to a select line and arranged between two adjacent said banks, wherein each of said select transistors couples one of said local bit lines to one of said global bit lines to select the memory cells coupled to said local bit line.

2. The integrated circuit according to claim 1, wherein said memory cells comprise EPROM cells.

3. The integrated circuit according to claim 1, wherein said memory cells comprise flash memory cells.

4. The integrated circuit according to claim 1, wherein said memory cells comprise FRAM cells.

5. An integrated circuit with distributed drivers of XDEC, said integrated circuit comprising:
   a pre-decoder area;
   a plurality of driver areas, wherein each said driver area is pre-decoded by said pre-decoder area; and
   a plurality of memory array areas, wherein each said memory array area has two said driver areas on both sides of each said memory array area to drive each said memory array area, and each said memory array area comprising,
      a plurality of memory cell areas; and
      a plurality of select areas, wherein each said select area is between two adjacent said memory cell areas and has a plurality of coupled select transistors, and each said select transistor of said coupled select transistors couples two adjacent said memory cell areas.

6. The integrated circuit according to claim 5, wherein said memory cells comprise EPROM cells.

7. The integrated circuit according to claim 5, wherein said memory cells comprise flash memory cells.

8. The integrated circuit according to claim 5, wherein said memory cells comprise FRAM cells.

9. A method of selecting a memory cell in an integrated circuit, wherein said integrated circuit comprises banks having memory cells arranged in rows and columns, word lines coupling said rows of memory cells, local bit lines coupling said memory cells arranged in the same columns of two adjacent said banks, coupled select transistors arranged between two adjacent said banks used to select said memory cells arranged in the same columns of two adjacent said banks via said local bit lines, select lines coupling said coupled select transistors and global bit lines coupling said coupled select transistors, said method comprising:
   selecting two said select lines separately on two sides of a bank having said memory cell to decode said select transistors and select said bank;
   selecting two said global bit lines to select two said select transistors coupling said memory cell via two said local bit lines; and
   selecting said word line coupling said memory cell.

* * * * *